(12) United States Patent
Juskey et al.

(10) Patent No.: US 7,247,933 B2
(45) Date of Patent: Jul. 24, 2007

(54) THIN MULTIPLE SEMICONDUCTOR DIE PACKAGE

(75) Inventors: Frank J. Juskey, Apopka, FL (US); Daniel K. Lau, San Francisco, CA (US)

(73) Assignee: Advanced Interconnect Technologies Limited, Fort Louis (MU)

( * ) Notice: Subject to any disclaimer, the term of this patent is extended or adjusted under 35 U.S.C. 154(b) by 0 days.

(21) Appl. No.: 10/542,211

(22) PCT Filed: Feb. 3, 2004

(86) PCT No.: PCT/US2004/003170
§ 371 (c)(1),
(2), (4) Date: Mar. 16, 2006

(87) PCT Pub. No.: WO2004/070792
PCT Pub. Date: Aug. 19, 2004

(65) Prior Publication Data
US 2006/0231937 A1    Oct. 19, 2006

Related U.S. Application Data

(60) Provisional application No. 60/445,677, filed on Feb. 6, 2003, provisional application No. 60/444,987, filed on Feb. 4, 2003.

(51) Int. Cl.
*H01L 23/02* (2006.01)
*H01L 21/00* (2006.01)

(52) U.S. Cl. ............ 257/686; 257/685; 257/E25.006; 257/E25.013; 257/E25.018; 257/E25.021; 257/E25.027; 257/E23.085; 257/E21.614; 438/109

(58) Field of Classification Search ......... 257/685, 257/777, E25.006, E25.013, E25.018, E25.021, 257/E25.027, E23.085, E21.614; 438/109, 438/FOR. 368, FOR. 426
See application file for complete search history.

(56) References Cited

U.S. PATENT DOCUMENTS

| | | | |
|---|---|---|---|
| 4,982,265 A | | 1/1991 | Watanabe et al. |
| 4,996,587 A | * | 2/1991 | Hinrichsmeyer et al. ... 257/676 |
| 5,138,438 A | | 8/1992 | Masayuki et al. |
| 6,180,881 B1 | * | 1/2001 | Isaak ......................... 174/524 |
| 6,452,278 B1 | | 9/2002 | DiCaprio et al. |
| 6,849,949 B1 | * | 2/2005 | Lyu et al. ................... 257/777 |
| 6,876,066 B2 | * | 4/2005 | Fee et al. ................... 257/666 |
| 6,982,488 B2 | * | 1/2006 | Shin et al. .................. 257/777 |

* cited by examiner

*Primary Examiner*—Jasmine Clark
(74) *Attorney, Agent, or Firm*—Wiggin and Dana LLP; Gregory S. Rosenblatt

(57) ABSTRACT

A method and apparatus for forming a multiple semiconductor die assembly (200, 300, 400) having a thin profile are presented. The semiconductor die assembly (200, 300, 400) comprises a plurality of die packages (100), with each die package (100) including a lead frame (10) having a plurality of leads (11) each having a down set portion (101) extending from (14). A semiconductor die (30) is disposed in a central region (12) of the lead frame (10) and is electrically connected (11). An encapsulant (50) is disposed in the central region (12) and covers to the semiconductor die (30) and a portion (11). The first surface (14) of the leads (11) and a first surface (34) of the semiconductor die (30) are substanial exposed from the encapsulant (50). The first surface (34) of the semiconductor die (30) and the down set portions (101) form a cavity (102). The semiconductor die packages (200, 300, 400) are stacked such that at least a portion of the encapsulant (50) is disposed in the cavity of a next higher semiconductor die package (200, 300, 400) in the stack.

18 Claims, 9 Drawing Sheets

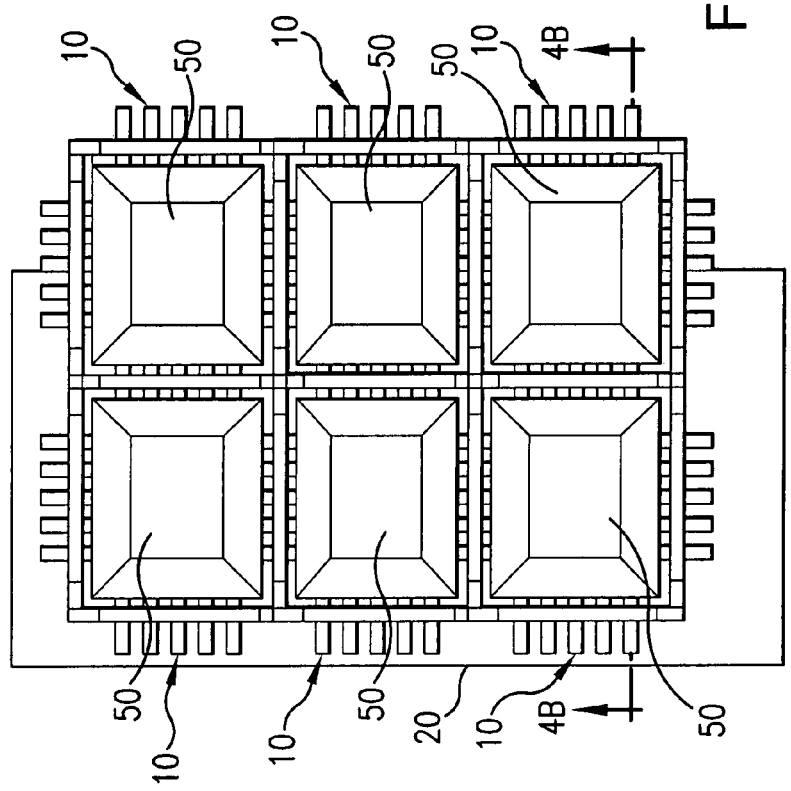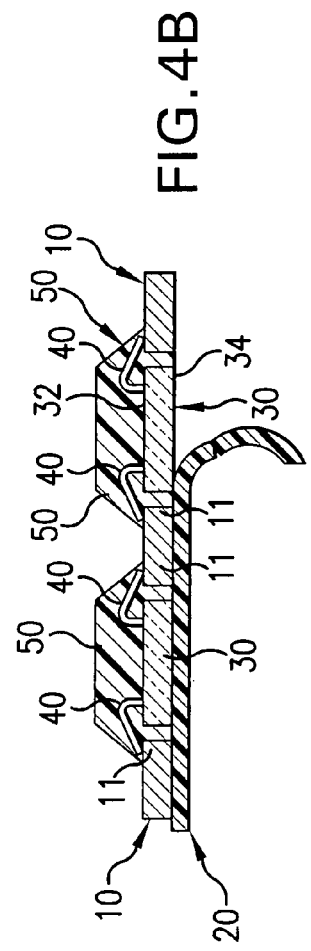

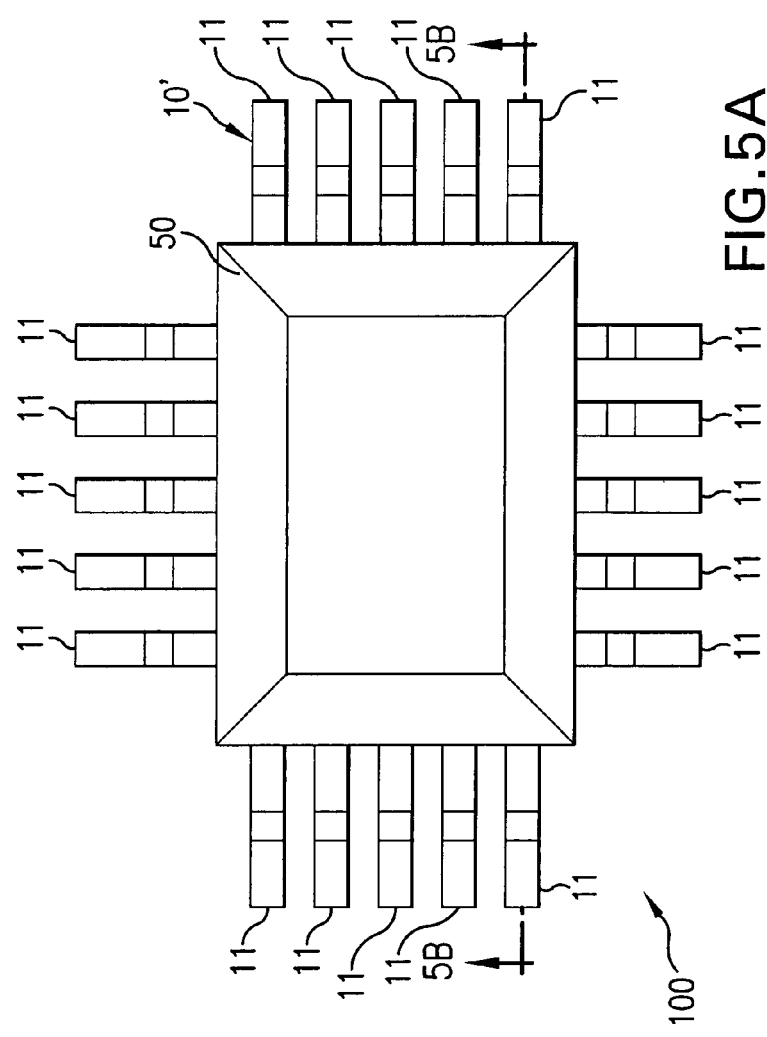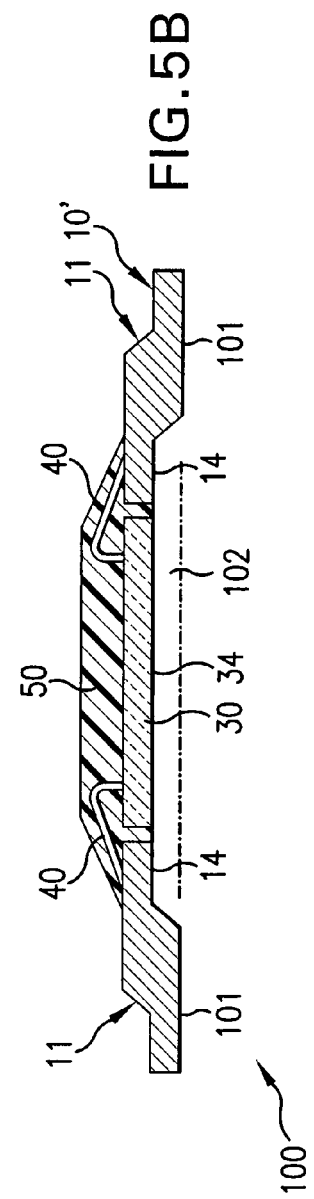

| A). LEAD FRAME THICKNESS | 0.200 MM | 8 mils |
| B). LEAD FRAME FORM | 0.100 MM | 4 mils |
| C). MOLD CAP THICKNESS | 0.250 MM | 10 mils |
| A+B+C | 0.550 MM | 22 mils |
| B+C | 0.350 MM | 14 mils |

THIN MULTIPLE SEMICONDUCTOR DIE PACKAGE

CROSS REFERENCE TO RELATED APPLICATIONS

This application claims the benefit of U.S. Provisional Patent Application No. 60/445,677, filed Feb. 6, 2003, and U.S. Provisional Application No. 60/444,987, filed Feb. 4, 2003, both of which are incorporated by reference herein in their entirety.

BACKGROUND OF THE INVENTION

1. Field of the Invention

The present invention relates generally to semiconductor manufacture and, more particularly, to the packaging of a multiple semiconductor die assembly.

2. Description of Prior Art

Portable electronic devices such as, for example, radiotelephones, pagers and personal electronic assistants (PDAs), are becoming increasingly complex, while also being provided in increasingly smaller and lighter form factors. Semiconductor chips or dice such as, for example a microprocessor die and a memory die, are used within the portable electronic devices. Typically, a die is provided in a ceramic or plastic packaging that provides support, protection, dissipates heat for the die and provides a lead system for power and signal distribution.

There is a desire in the semiconductor packaging industry to minimize the profile (thickness) of semiconductor packages to facilitate advances in mobile, wireless, and medical applications. Current demands are for packages having profiles in the sub-millimeter level. A need for increased processing power and speed has also created a demand to increase the number of dies that can be fit into a given area (i.e., to increase die density) and to decrease the length of the electrical path between dies.

One solution to the demand for increased die density and decreased path length is known as a multi-chip module (CM), in which a number of dies are stacked inside a single molded package. Within the package, the dies are separated by insulating layers/interposers with wire-bond and/or flip die connections used to electrically connect the dies to a common lead frame. This solution, however, has its drawbacks. For example, a package with stacked dies introduces complexity in the assembly of the package due at least in part to the increased number of electrical connections and the need for an insulative layer/interposer to be disposed between the dies. If any defects occur during the assembly of the package, the entire package, including both chips, is unsalvageable.

One example of an MCM package is U.S. Pat. No. 6,452,278, issued Sep. 17, 2002, to Vincent DiCaprio et al. DiCaprio et al. describe a package including a substrate having a central aperture. DiCaprio et al. further describe one or more semiconductor dice disposed within the aperture to provide a thin profile.

As is appreciated by those in the art, there are higher costs associated with reworking a failure in packages including multiple dies as opposed to reworking a failed, single die package. To minimize rework cost, semiconductor manufacturing employs a Known Good Die (KGD) rule. Generally speaking, the KGD rule refers to a die level product provided by a semiconductor die manufacturer that carries with it a certain level of guaranteed reliability and, as a result, a higher price per die. The rule of thumb in MCM manufacturing is that if more than five dice of any given type, or devices with more than 200 bonds, are included in a single package, they should be KGD. This rule evolved from industry's experience with the high cost of rework at the die level compared to the cost of replacing failed, packaged parts at the board level. Cost impacts are likewise more severe when the user encounters a failed MCM, as opposed to the cost of replacing an individually packaged integrated circuit (IC).

Accordingly, the inventors realized that a need exists for semiconductor packages having higher die densities (e.g., more than one die in a package), a thin profile and which balance rework costs with the cost of procuring guaranteed KGD.

BRIEF SUMMARY OF THE INVENTION

The above-described and other needs are met by a semiconductor die assembly, comprising: a plurality of die packages, each including: a lead frame having a plurality of leads surrounding a central region, each of the leads having a first surface and a down set portion extending from the first surface; a semiconductor die disposed in the central region and electrically connected to the leads, the semiconductor die having a first surface formed thereon with the first surface of the semiconductor die being substantially coplanar with the first surface formed on each of the leads; and an encapsulant disposed in the central region and covering the semiconductor die and a portion of the leads. The first surface of the leads and the first surface of the semiconductor die are exposed from the encapsulant, and the first surface of the semiconductor die and the down set portions of the leads form a cavity. The plurality of die packages are stacked such that at least a portion of the encapsulant is disposed in the cavity of a next higher die package in the stack.

In one embodiment, the leads of a top die package in the stack are down set further than the leads of a lower die package in the stack. In another embodiment, the leads of the die packages in the stack are of equal length.

The lower surfaces of the down set portions of at least one die package in the stack may be soldered to the upper surfaces of the down set portions of an adjacent die package in the stack. In one embodiment, solder balls are be attached to the down set portions of the packages prior to stacking the packages. The packages in the stack may be adhered together prior to being soldered. The sides of the encapsulant may be tapered, and the plurality of leads may be disposed on two or more sides of the central region.

In another aspect of the invention, a method for forming a semiconductor die assembly comprises: forming a plurality of individual semiconductor die packages, including: providing a lead frame having a plurality of leads surrounding a central region, each of the leads including a first surface formed thereon, disposing a semiconductor die in the central region, the semiconductor die having a first surface formed thereon, the first surface of the semiconductor die being substantially coplanar with the first surface formed on each of the leads, electrically connecting the semiconductor die to the leads, covering a portion of the semiconductor die and a portion of the leads with an encapsulant, and shaping each of the leads to include a first surface and a down set portion extending from the first surface, the first surface of the leads and the first surface of the semiconductor die being exposed from the encapsulant, and the first surface of the semiconductor die and the down set portions of the leads forming a cavity. The method further comprises stacking the plurality of individual semiconductor die packages such that at least a portion of the encapsulant is disposed in the cavity of a next higher semiconductor die package in the stack; and electrically interconnecting corresponding leads of the stacked semiconductor die packages.

The packages in the stack may be adhered together prior to being soldered. The adhering may be performed, for example, using adhesive paste, adhesive film, or adhesive liquid. The sides of the encapsulant may be tapered, and the plurality of leads may be disposed on two or more sides of the central region.

In one embodiment, the leads of a top semiconductor die package in the stack are down set further than the leads of a lower semiconductor die package in the stack. In another embodiment, the leads of the die packages in the stack are of equal length.

Electrically interconnecting the leads may include soldering the lower surfaces of the down set portions of at least one semiconductor die package in the stack to the upper surfaces of the down set portions of an adjacent die package in the stack. Solder balls may be attached to the down set portions of the packages prior to stacking the packages. Alternatively, the soldering may be performed by dipping the leads in a solder bath. The method may further include adhering the packages in the stack together prior to dipping.

The details of one or more embodiments of the invention are set forth in the accompanying drawings and the description below. Other features, objects and advantages of the invention will be apparent from the description and drawings, and from the claims.

BRIEF DESCRIPTION OF THE DRAWINGS

The above set forth and other features of the invention are made more apparent in the ensuing Detailed Description of the Preferred Embodiments when read in conjunction with the attached Drawings, wherein:

FIG. 4A is a plan view of the support structure of FIG. 3A illustrating removal of a carrier portion of the support structure;

FIG. 4B is a side, cross-sectional view of the semiconductor die package of FIG. 4A;

FIG. 5A is a plan view of the support structure of FIG. 4A illustrating forming of fingers of the lead frame;

FIG. 5B is a side, cross-sectional view of the semiconductor die package of FIG. 5A;

Identically labeled elements appearing in different ones of the above-described figures are intended to refer to the same elements but may not be referenced in the description for all figures.

DETAILED DESCRIPTION OF THE PREFERRED EMBODIMENTS

Figure 1A:
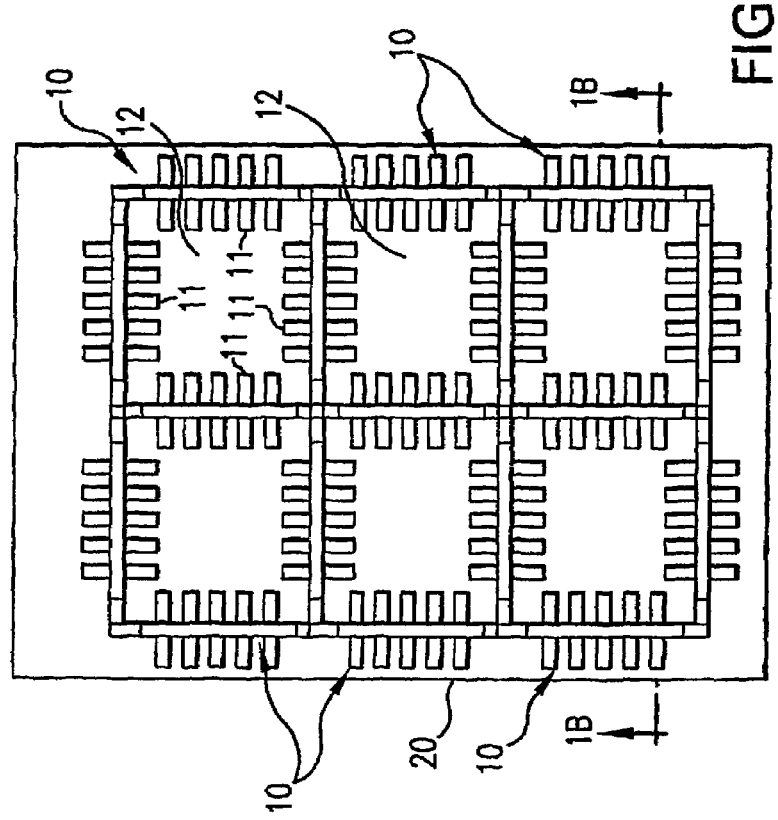
FIG. 1A is a plan view of a support structure for a semiconductor die package including a lead frame and a carrier.
Figure 1B:
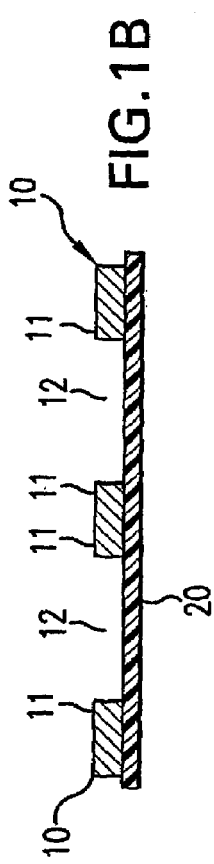
FIG. 1B is a side, cross-sectional view of the semiconductor die package support structure of FIG. 1A.

FIGS. 1A and 1B illustrate a plurality of interconnected lead frames 10 disposed on a carrier 20 such as, for example, a thin tape or laminate. In one embodiment, the carrier 20 is a thin tape made of polyimide or another plastic material. In accordance with one aspect of the present invention, each lead frame 10 is configured as a plurality of leads 11 disposed around a central region 12. In the embodiment shown, each lead frame 10 includes five leads 11 disposed on each of the four sides of the central region 12. It will be appreciated, however, that the number and location of the leads 11 may be modified as needed for a particular application. For example, the lead frame 10 may include two sets of leads disposed on opposing sides of the central region 12. The interconnected lead frames 10 may be formed from a sheet of any suitable conductor and is preferably copper or a copper-based alloy. By copper-base alloy it is meant that the material contains more than 50%, by weight, of copper.

Figure 2A:
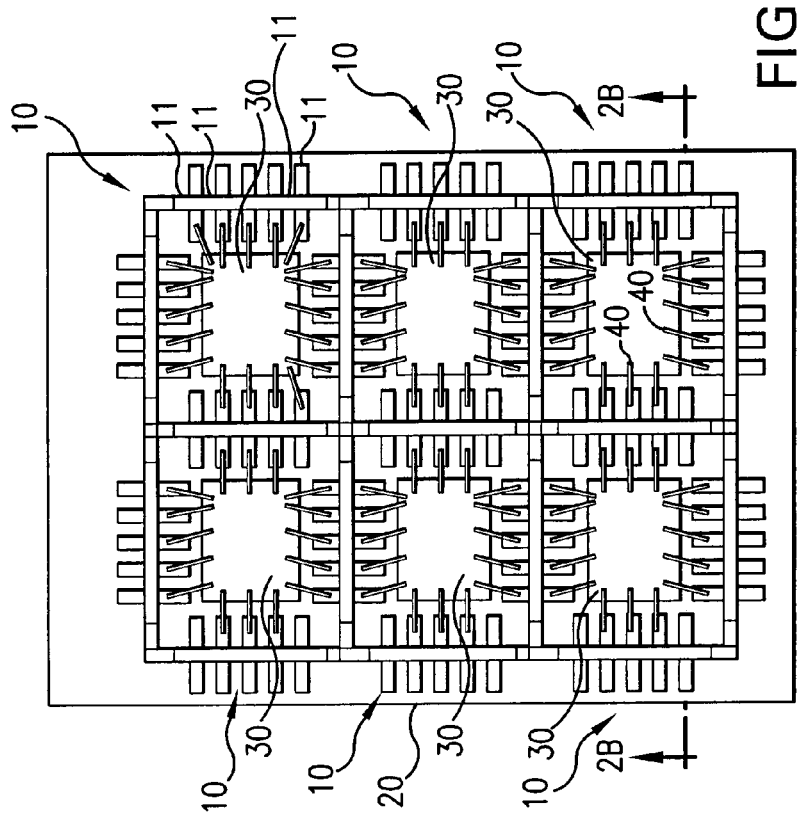
FIG. 2A is a plan view of the support structure of FIG. 1A with semiconductor dies attached therein.
Figure 2B:
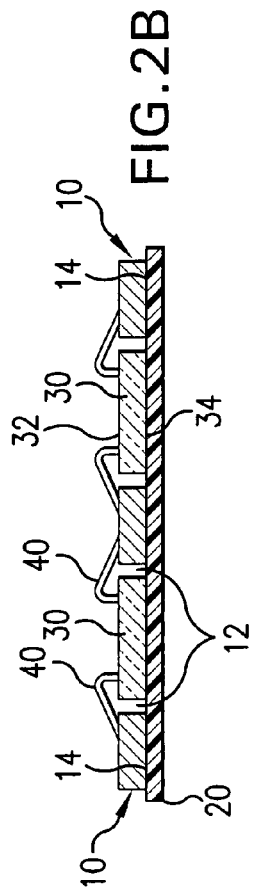
FIG. 2B is a side, cross-sectional view of the semiconductor die package support structure of FIG. 2A.

As shown in FIGS. 2A and 2B, a plurality of semiconductor dice 30 are positioned within the central regions 12 of lead frames 10. Each of the dice 30 includes a top surface 32 and a bottom surface 34. The carrier 20 supports the bottom surface 34 of the die 30. It should be appreciated that each of the plurality of semiconductor dice 30 are disposed in central regions 12 such that the bottom surface 34 of each die 30 is substantially coplanar with a bottom surface 14 of the lead frame 10.

Wires 40 are bonded from the top surface 32 of each die 30 to a corresponding lead 11 to electrically couple the die 30 to the lead frame 10. For example, the wirebonding may be performed using ultrasonic bonding, where a combination of pressure and ultrasonic vibration bursts are applied to form a metallurgical cold weld, thermocompression bonding, where a combination of pressure and elevated temperature are applied to form a weld, or thermosonic bonding where a combination of pressure, elevated temperature, and ultrasonic vibration bursts are applied to form a weld. The type of wire used in the bonding is preferably made from gold, gold based alloy, aluminum or aluminum based alloy. As an alternative to wirebonding, tape automated bonding (TAB) may be used.

Figure 3A:
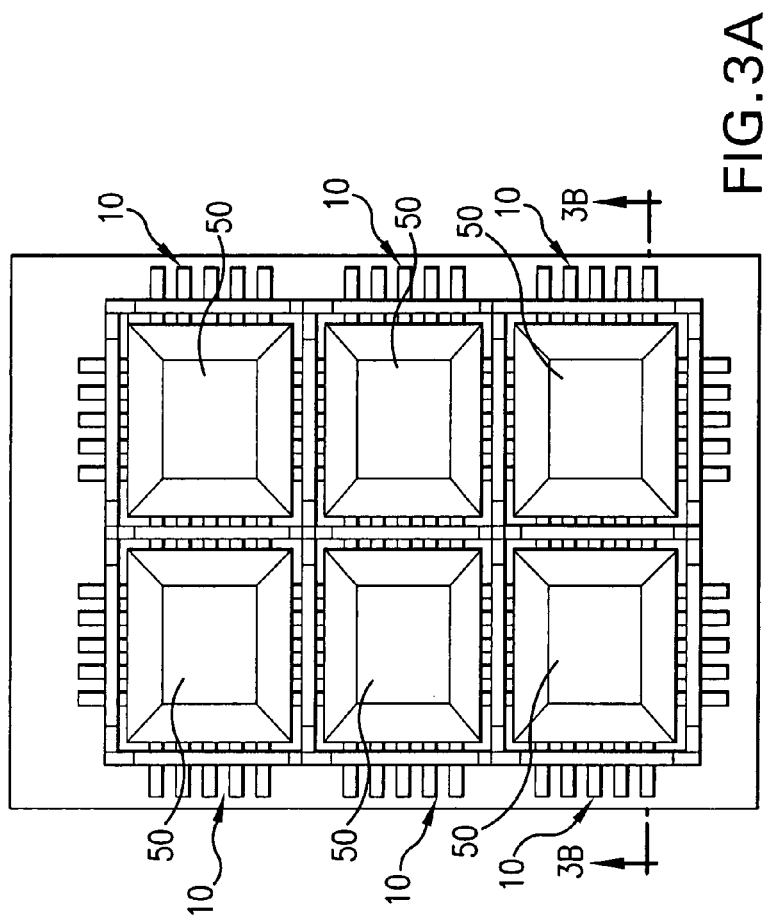
FIG. 3A is a plan view of the support structure of FIG. 2A illustrating a molding operation.
Figure 3B:
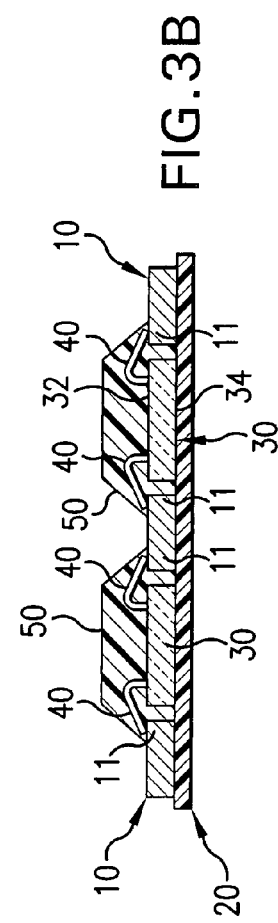
FIG. 3B is a side, cross-sectional view of the semiconductor die package of FIG. 3A.

As shown in FIGS. 3A and 3B, an encapsulant (molding compound) 50 is individually molded over each of the plurality of dice 30, wires 40, and wire 40 bond sites such that the encapsulant 50 substantially encompasses each of the dice 30, e.g., by filling corresponding central regions 12. The encapsulant 50 may be applied using any convenient technique, such as a transfer or injection molding process. The encapsulant 50 may also be a low temperature thermal glass composite. In one embodiment, sides of the encapsulant 50 are tapered.

Once the encapsulant 50 is applied to the lead frame 10, the carrier 20 may be removed. FIGS. 4A and 4B, illustrate the removal operation. When complete, each die 30 is suspended within the central regions 12 of the lead frame 10 by the encapsulant 50. The top surface 32 of each die 30 and a portion of each lead 11 are encapsulated while the bottom surface 34 of each die 30 and the bottom surface 14 of each lead are exposed.

With carrier 20 removed the interconnected portions of the lead frames 10 are cut to singulate individual semiconductor die packages. Singulation of the packages may be performed by die punch, sawing with a blade, water jet, laser, or the like. FIGS. 5A and 5B illustrate a singulated semiconductor die package, shown generally at 100. As shown in FIGS. 5A and 5B, the leads 11 are formed in an "s-like" shape to include a down set portion 101. For example, the leads may be configured into the "s-like" shape after singulation by bending or otherwise forming. The leads 11 extend down from the plane formed by the bottom surface 34 of the die 30 to provide a cavity, shown generally at 102, below the die 30. Once singulated, the packages 100 may be tested and burned-in in accordance with industry standard processes to ensure KGD reliability. Preferably, the packages 100 are tested before they are stacked into the die assemblies described below. The packages 100 may be electrically connected to an external circuit, such as a printed circuit board or another semiconductor device package, at any exposed surface of the contacts 11.

Figures 6A, 6B:
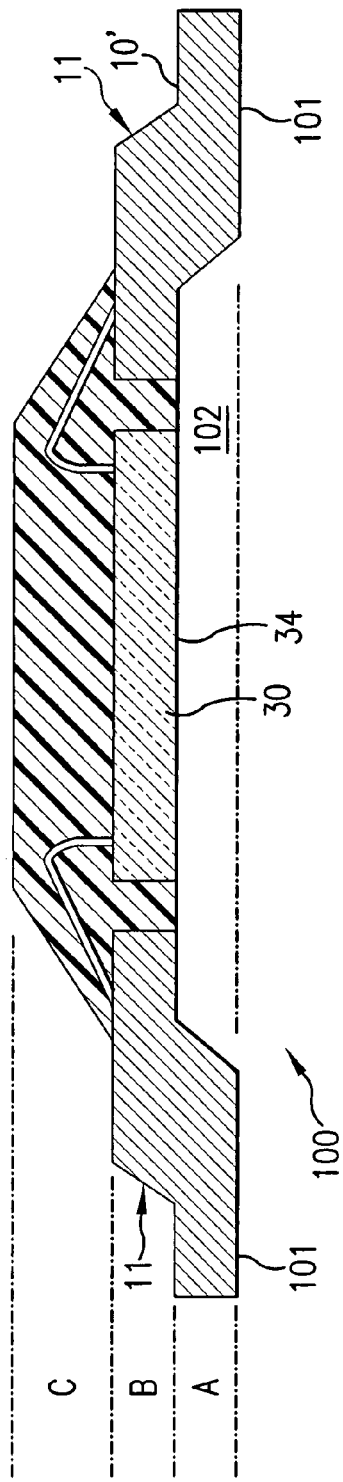
FIGS. 6A and 6B illustrate exemplary features of one embodiment of a semiconductor die package of the present invention.

FIGS. 6A and 6B illustrate one embodiment of the semiconductor die package 100 configured in accordance with an embodiment of the present invention. Three exemplary dimensions are labeled "A", "B" and "C" and illustrate thickness of the package 100. As shown, the novel configuration of the package 100 facilitates formation of stacked, multiple semiconductor die packages having a thin profile.

Figure 7:
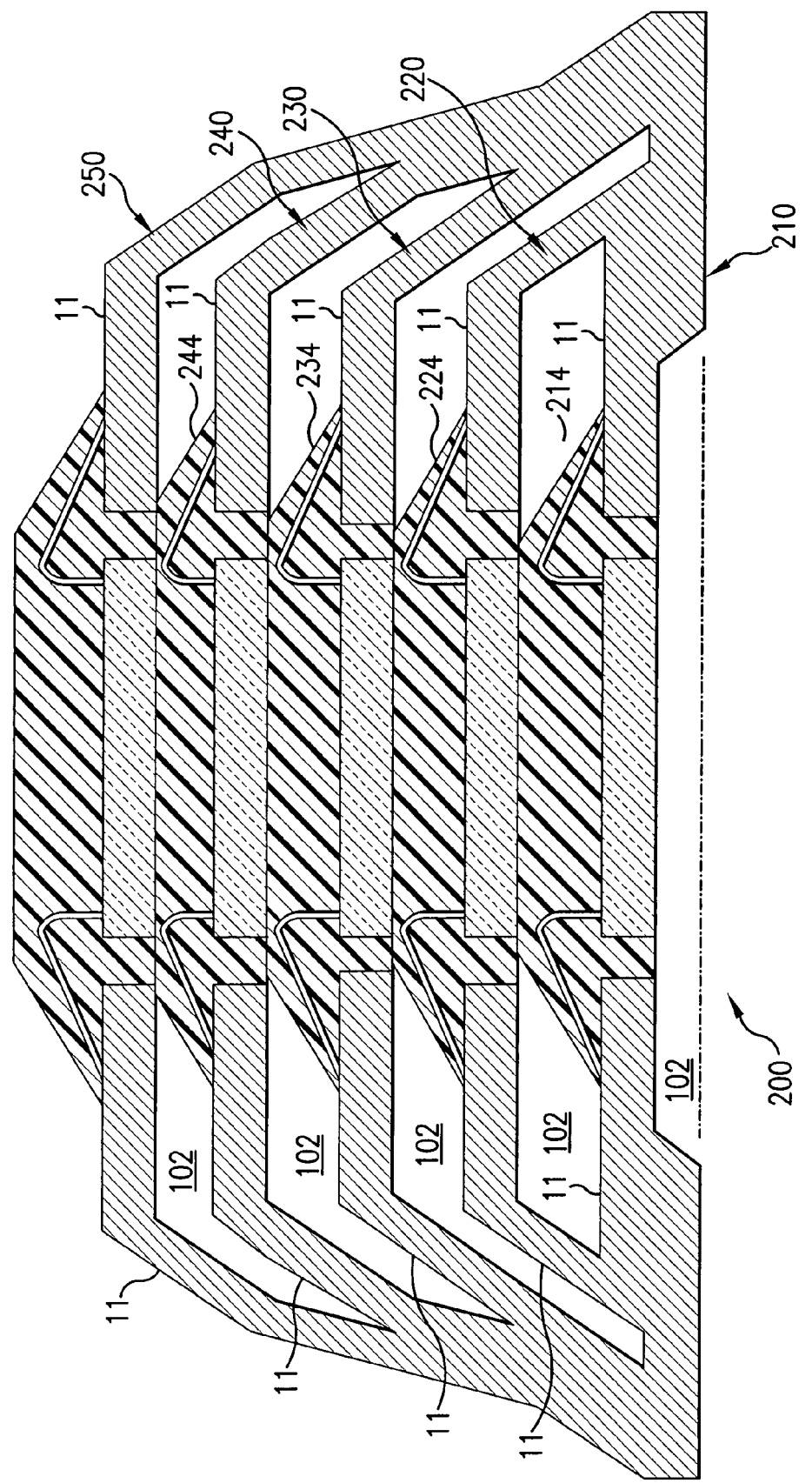
FIG. 7 illustrates an exemplary stacked multiple semiconductor die assembly constructed in accordance with one embodiment of the present invention.

For example, FIG. 7 illustrates a five (5) semiconductor die assembly 200 wherein layered die packages 210, 220, 230, 240, and 250, respectively, are assembled. It should be appreciated that each of the die packages 210, 220, 230, 240, and 250 are identical to die package 100, except that dimensions A of corresponding leads 11 vary to accommodate lower level packages. As shown in FIG. 7, as the die package 200 is assembled, the encapsulated portion of a lower die package is positioned in cavity 102 formed by a next higher stacked die package in the assembly 200. For example, die package 210 is assembled such that its encapsulated die 30 and wires 40 (collectively referenced at 214) are disposed within cavity 102 of die package 220, die package 220 is assembled so that its encapsulated die and wires 224 are disposed within cavity 102 of die package 230, die package 230 is assembled such that its encapsulated die and wires 234 are disposed within cavity 102 of die package 240 and die package 240 is assembled such that its encapsulated die and wires 244 are disposed within cavity 102 of die package 250. After the die packages 210, 220, 230, 240, and 250 are stacked, corresponding leads 11 are electrically interconnected by way of soldering or the like. The soldering may be performed, for example, using solder balls attached to the leads 11, or by dipping the leads 11 in a solder bath.

It should be appreciated that the relative thickness of the die assembly 200 is calculated by a tally of successive sets of the A, B and C, or B and C dimensions of the associated die packages 210-250 as follows.

First Layer—die package 210, thickness=A+B+C; plus
Second Layer—die package 220, thickness=B+C (since dimension A is already accounted for by the lower layer); plus
Third Layer—die package 230, thickness=B+C; plus
Fourth Layer—die package 240, thickness=B+C; plus
Fifth Layer—die package 250, thickness=B+C.

Accordingly, stacked die packages assembled as shown with respect to die assembly 200 realize a thinner profile than stacked die packages wherein each die package is simply assembled upon a lower level package.

Figure 8:
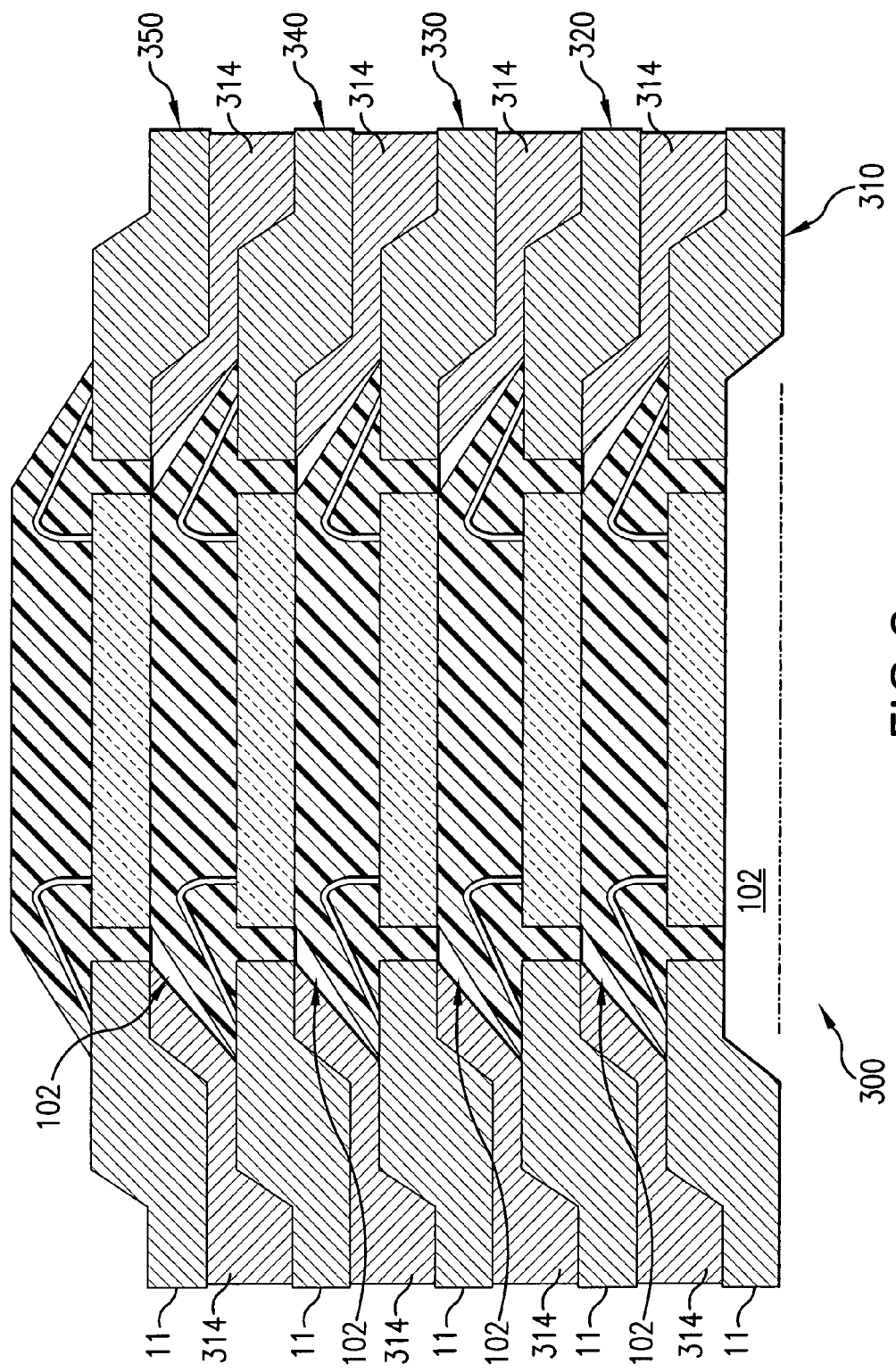
FIG. 8 illustrates an exemplary stacked multiple semiconductor die assembly constructed in accordance with another embodiment of the present invention.

FIG. 8 illustrates a five (5) semiconductor die assembly 300 having layered die packages 310, 320, 330, 340 and 350, respectively, assembled in accordance with another embodiment of the present invention. Die packages 310, 320, 330, 340, and 350 are identical to die package 100 of FIGS. 5A and 5B. As shown in FIG. 8, leads 11 of die packages 310, 320, 330, 340 and 350 are of a similar dimension, e.g., dimension A (height of a lead 11) is uniform for each of the leads 11. In the embodiment of FIG. 8, as well as in any other embodiment described herein, the die packages 310, 320, 330, 340, and 350 may be bonded together in a layered manner with an adhesive such as, for example, a cyanoacrolate adhesive or the like, or an unsupported tape adhesive before connecting leads 11. The adhesive may be in the form of an adhesive paste, adhesive film, or adhesive liquid.

In this embodiment, the adhesively bonded die packages 310, 320, 330, 340, and 350 are electrically interconnected by dipping the adhesively bonded packages 310, 320, 330, 340, and 350 into a high temperature solder bath such that the leads 11 are bonded together by solder that remains between them, shown generally at 314. As shown in FIG. 8, the solder 314 effectively closes the cavities 102 of die packages 320, 330, 340 and 350. It should be appreciated that the relative thickness of the die assembly 300 is calculated as described above with reference to die assembly 200.

Figure 9:
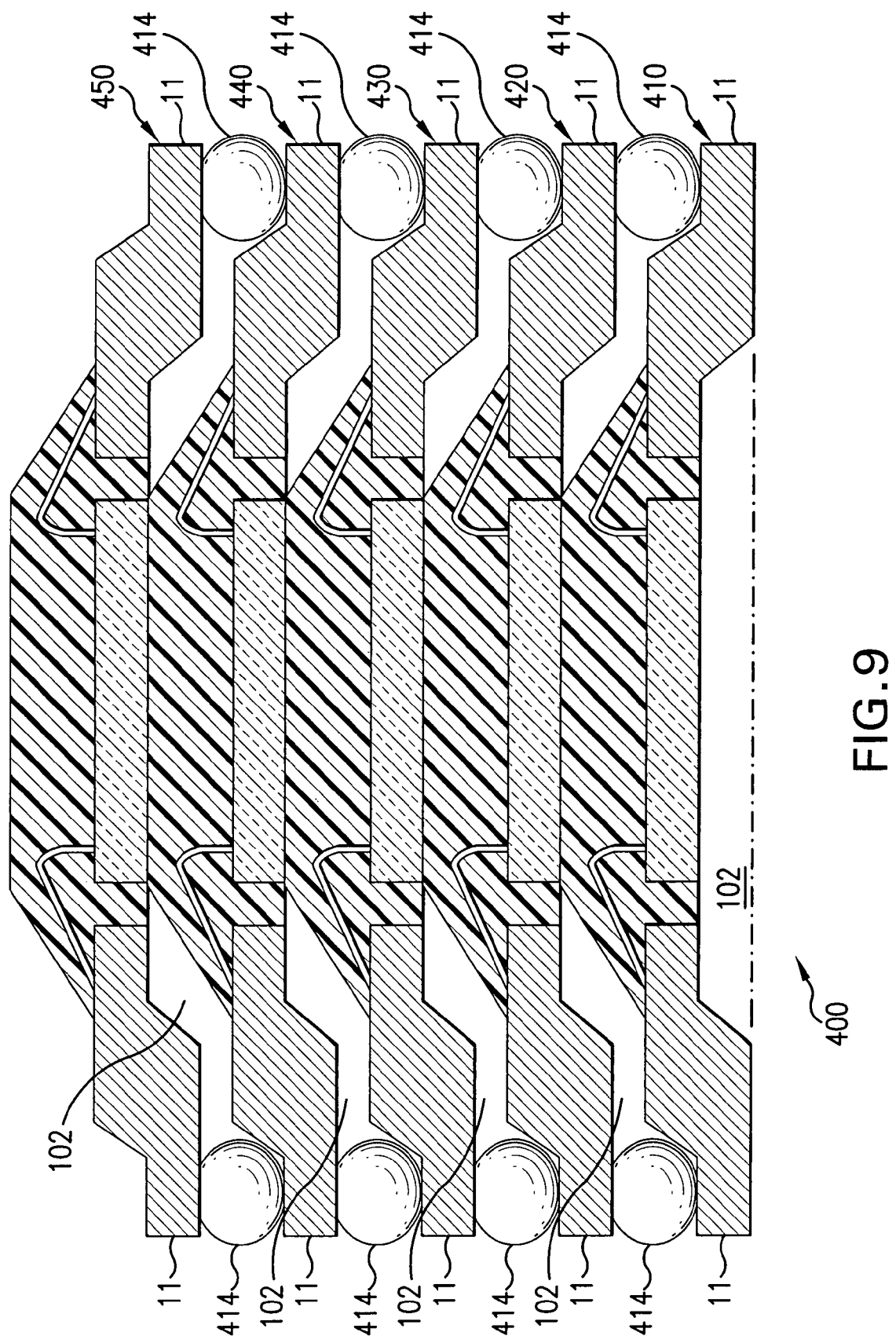
FIG. 9 illustrates an exemplary stacked multiple semiconductor die assembly constructed in accordance with yet another embodiment of the present invention.

FIG. 9 illustrates a five (5) semiconductor die assembly 400 having layered die packages 410, 420, 430, 440 and 450, respectively, assembled in accordance with yet another embodiment of the present invention. As with the assembly 300 of FIG. 8, leads 11 of die packages 410, 420, 430, 440 and 450 have a similar height dimension, e.g., dimension A, and die packages 410, 420, 430, 440, and 450 are identical to die package 100 of FIGS. 5A and 5B. In this embodiment, the layered die packages 410, 420, 430, 440 and 450 are electrically interconnected by melting high temperature solder balls 414 between the leads 11 of the die packages 410, 420, 430, 440 and 450. The solder balls 414 may be attached to the down set portions 101 of the leads 11 of each package after singulation of the package and, preferably, before stacking the packages. After the packages have been stacked, the solder balls 414 may be melted and cooled to join adjacent leads 11. As shown in FIG. 9, the solder balls 414 effectively close cavities 102 of respective die packages 420, 430, 440 and 450. It should be appreciated that the relative thickness of the die assembly 400 is calculated as described above with reference to die assembly 200.

It should also be appreciated that FIGS. 1A-5B depict exemplary stages of assembly of a stacked semiconductor package, such as those shown in FIGS. 7, 8 and 9.

In each of the embodiments described herein, the configuration of leads 11 allows a plurality of packages to be stacked to provide increased chip density while maintaining a thin assembly profile. Compared to conventional methods of increasing chip density, which employ stacked dies in a common molded package to reduce the profile of the stack, the stacked package of the present invention reduces complexity in the assembly of the package while providing similar stack profiles and chip densities. The reduction in complexity is due at least in part to the elimination of an insulative layer/interposer between dies in a common package, which must be used with the prior art configuration. Furthermore, the packages of the present invention provide the ability to test from top, bottom, or sides. If any of the packages are found to be defective, the individual package and its chip can be discarded, thus reducing the waste associated with prior art packages that require the disposal of multiple chips in a common package. The present invention provides for a reduced profile package that may be used alone or may be stacked where an increase in chip density is required.

While the invention has been described and illustrated in connection with preferred embodiments, many variations and modifications, as will be apparent to those of skill in the art, may be made without departing from the spirit and scope of the invention. By example, and as discussed above, the teachings of this invention are not intended to be limited to any specific number of stacked die package arrangement, such as the five die package arrangement described in detail above. That is, it should be appreciated that aspects of the present invention apply equally to other semiconductor arrangements where a thinner profile is desirable.

Accordingly, the invention as set forth in the appended clams is not limited to the precise details of construction set forth above as such other variations and modifications as would be apparent to one skilled in the art are intended to be included within the spirit and scope of the invention as set forth in the defined claims.

What is claimed is:

1. A semiconductor die assembly (200, 300, 400), comprising:
a plurality of die packages (100), each including:
a lead frame (10) having a plurality of leads (11) surrounding a central region (12), each of the leads (11) having a first surface (14) and a down set portion (101) extending from the first surface (14),
a semiconductor die (30) disposed in the central region (12) and electrically connected to the leads (11), the semiconductor die (30) having a first surface (34) formed thereon, the first surface (34) of the semiconductor die (30) being substantially coplanar with the first surface (14) formed on each of the leads (11), and
an encapsulant (50) disposed in the central region (12) and covering the semiconductor die (30) and a portion of the leads (11), the first surface (14) of the leads (11) and the first surface (34) of the semiconductor die (30) being exposed from the encapsulant (50), and the first surface (34) of the semiconductor die (30) and the down set portions (101) of the leads (11) forming a cavity (102);
wherein the plurality of die packages (100) are stacked such that at least a portion of the encapsulant (50) is disposed in the cavity (102) of a next higher die package (100) in the stack.

2. The semiconductor die assembly (200) of claim 1, wherein the leads (11) of a top die package (100) in the stack are down set further than the leads (11) of a lower die package (100) in the stack.

3. The semiconductor die assembly (300, 400) of claim 1, wherein the lower surfaces of the down set portions (101) of at least one die package (100) in the stack is soldered to the upper surfaces of the down set portions (101) of an adjacent die package (100) in the stack.

4. The semiconductor die assembly (300, 400) of claim 3, wherein the packages (100) in the stack are adhered together prior to being soldered.

5. The semiconductor die assembly (200, 300, 400) of claim 1, wherein the sides of the encapsulant (50) are tapered.

6. The semiconductor die assembly (200, 300, 400) of claim 1, wherein the plurality of leads (11) are disposed on two or more sides of the central region (12).

7. A semiconductor die assembly (300, 400), comprising:
a plurality of die packages (100), each including:
a lead frame (10) having a plurality of leads (11) surrounding a central region (12), each of the leads (11) having a first surface (14) and a down set portion (101) extending from the first surface (14),
a semiconductor die (30) disposed in the central region (12) and electrically connected to the leads (11), the semiconductor die (30) having a first surface (34) formed thereon, the first surface (34) of the semiconductor die (30) being substantially coplanar with the first surface (14) formed on each of the leads (11), and
an encapsulant (50) disposed in the central region (12) and covering the semiconductor die (30) and a portion of the leads (11), the first surface (14) of the leads (11) and the first surface (34) of the semiconductor die (30) being exposed from the encapsulant (50), and the first surface (34) of the semiconductor die (30) and the down set portions (101) of the leads (11) forming a cavity (102);
wherein the plurality of die packages (100) are stacked such that at least a portion of the encapsulant (50) is disposed in the cavity (102) of a next higher die package (100) in the stack and wherein the leads (11) of each die package (100) in the stack are of equal length.

8. A semiconductor die assembly (400), comprising:
a plurality of die packages (100), each including:
a lead frame (10) having a plurality of leads (11) surrounding a central region (12), each of the leads (11) having a first surface (14) and a down set portion (101) extending from the first surface (14),
a semiconductor die (30) disposed in the central region (12) and electrically connected to the leads (11), the semiconductor die (30) having a first surface (34) formed thereon, the first surface (34) of the semiconductor die (30) being substantially coplanar with the first surface (14) formed on each of the leads (11), and
an encapsulant (50) disposed in the central region (12) and covering the semiconductor die (30) and a portion of the leads (11), the first surface (14) of the leads (11) and the first surface (34) of the semiconductor die (30) being exposed from the encapsulant (50), and the first surface (34) of the semiconductor die (30) and the down set portions (101) of the leads (11) forming a cavity (102);
wherein the plurality of die packages (100) are stacked such that at least a portion of the encapsulant (50) is disposed in the cavity (102) of a next higher die package (100) in the stack and solder balls (414) are attached to the down set portions (101) of the packages (100) prior to stacking the packages (100).

9. A method for forming a semiconductor die assembly (200, 300, 400), the method comprising:
forming a plurality of individual semiconductor die packages (100), including:
providing a lead frame (10) having a plurality of leads (11) surrounding a central region (12), each of the leads (11) including a first surface (14) formed thereon,
disposing a semiconductor die (30) in the central region (12), the semiconductor die (30) having a first surface (34) formed thereon, the first surface (34) of the semiconductor die (30) being substantially coplanar with the first surface (14) formed on each of the leads (11), electrically connecting the semiconductor die (30) to the leads (11), covering a portion of the semiconductor die (30) and a portion of the leads (11) with an encapsulant (50), and shaping each of the leads (11) to include a first surface (14) and a down set portion (101) extending from the first surface (14), the first surface (14) of the leads and the first surface (34) of the semiconductor die (30) being exposed from the encapsulant (50), and the first surface (34) of the semiconductor die (30) and the down set portions (101) of the leads (11) forming a cavity (102);

stacking the plurality of individual semiconductor die packages (100) such that at least a portion of the encapsulant (50) is disposed in the cavity (102) of a next higher semiconductor die package (100) in the stack; and electrically interconnecting corresponding leads (11) of the stacked semiconductor die packages (100).

10. The method of claim 9, wherein the leads (11) of a top semiconductor die package (100) in the stack are down set further than the leads (11) of a lower semiconductor die package (100) in the stack.

11. The method of claim 9, wherein the electrically interconnecting includes: soldering the lower surfaces of the down set portions (101) of at least one semiconductor die package (100) in the stack to the upper surfaces of the down set portions (101) of an adjacent semiconductor die package (100) in the stack.

12. The method of claim 11, further comprising:
dipping the leads (11) in a solder bath.

13. The method of claim 12, further comprising:
adhering the semiconductor die packages (100) in the stack together prior to dipping.

14. The method of claim 9, wherein the sides of the encapsulant (50) are tapered.

15. The method of claim 9, wherein the plurality of leads (11) are disposed on two or more sides of the central region (12).

16. The method of claim 9, further comprising,
adhering the semiconductor die packages (100) in the stack together prior to electrically interconnecting.

17. A method for forming a semiconductor die assembly (300, 400), the method comprising:

forming a plurality of individual semiconductor die packages (100), including:

providing a lead frame (10) having a plurality of leads (11) surrounding a central region (12), each of the leads (11) including a first surface (14) formed thereon, disposing a semiconductor die (30) in the central region (12), the semiconductor die (30) having a first surface (34) formed thereon, the first surface (34) of the semiconductor die (30) being substantially coplanar with the first surface (14) formed on each of the leads (11), electrically connecting the semiconductor die (30) to the leads (11), covering a portion of the semiconductor die (30) and a portion of the leads (11) with an encapsulant (50), and shaping each of the leads (11) to include a first surface (14) and a down set portion (101) extending from the first surface (14), the first surface (14) of the leads and the first surface (34) of the semiconductor die (30) being exposed from the encapsulant (50), and the first surface (34) of the semiconductor die (30) and the down set portions (101) of the leads (11) forming a cavity (102);

stacking the plurality of individual semiconductor die packages (100) such that at least a portion of the encapsulant (50) is disposed in the cavity (102) of a next higher semiconductor die package (100) in the stack and wherein the leads (11) of each semiconductor die package (100) in the stack are of equal length; and electrically interconnecting corresponding leads (11) of the stacked semiconductor die packages (100).

18. A method for forming a semiconductor die assembly (400), the method comprising:

forming a plurality of individual semiconductor die packages (100), including:

providing a lead frame (10) having a plurality of leads (11) surrounding a central region (12), each of the leads (11) including a first surface (14) formed thereon, disposing a semiconductor die (30) in the central region (12), the semiconductor die (30) having a first surface (34) formed thereon, the first surface (34) of the semiconductor die (30) being substantially coplanar with the first surface (14) formed on each of the leads (11), electrically connecting the semiconductor die (30) to the leads (11), covering a portion of the semiconductor die (30) and a portion of the leads (11) with an encapsulant (50), and shaping each of the leads (11) to include a first surface (14) and a down set portion (101) extending from the first surface (14), the first surface (14) of the leads and the first surface (34) of the semiconductor die (30) being exposed from the encapsulant (50), and the first surface (34) of the semiconductor die (30) and the down set portions (101) of the leads (11) forming a cavity (102);

attaching solder balls (414) to the down set portions (101) of the semiconductor die packages (100) prior to stacking the semiconductor die packages (100);

stacking the plurality of individual semiconductor die packages (100) such that at least a portion of the encapsulant (50) is disposed in the cavity (102) of a next higher semiconductor die package (100) in the stack; and electrically interconnecting corresponding leads (11) of the stacked semiconductor die packages (100).

* * * * *